US011460442B2

(12) United States Patent
Mendenhall et al.

(10) Patent No.: US 11,460,442 B2
(45) Date of Patent: Oct. 4, 2022

(54) PIPELINE TOOL WITH COMPOSITE MAGNETIC FIELD FOR INLINE INSPECTION

(71) Applicant: TDW Delaware, Inc., Wilmington, DE (US)

(72) Inventors: Todd R. Mendenhall, South Jordan, UT (US); David C. Rees, Ocoee, FL (US)

(73) Assignee: TDW Delaware, Inc., Wilmington, DE (US)

( * ) Notice: Subject to any disclaimer, the term of this patent is extended or adjusted under 35 U.S.C. 154(b) by 284 days.

(21) Appl. No.: 16/845,658

(22) Filed: Apr. 10, 2020

(65) Prior Publication Data

US 2020/0326310 A1 Oct. 15, 2020

Related U.S. Application Data

(60) Provisional application No. 62/832,663, filed on Apr. 11, 2019.

(51) Int. Cl.
| | | |
|---|---|---|
| *G01N 27/87* | (2006.01) | |
| *G01R 33/02* | (2006.01) | |
| *F16L 101/30* | (2006.01) | |

(52) U.S. Cl.
CPC .............. *G01N 27/87* (2013.01); *G01R 33/02* (2013.01); *F16L 2101/30* (2013.01)

(58) Field of Classification Search
CPC ...... G01N 27/87; G01R 33/02; F16L 2101/30
USPC ......................................................... 324/221
See application file for complete search history.

(56) References Cited

U.S. PATENT DOCUMENTS

| | | | | | |
|---|---|---|---|---|---|
| 4,330,748 | A | * | 5/1982 | Holden | ................ G01N 27/906 324/225 |
| 4,439,733 | A | * | 3/1984 | Hinshaw | ................ G01N 24/08 324/318 |
| 4,456,881 | A | * | 6/1984 | Compton | .................. H01F 7/20 324/309 |

(Continued)

OTHER PUBLICATIONS

Guoguang, Zhang. "Magnetizer design of circumferential magnetic flux leakage inspection in pipeline." 2010 International Conference on Computer Application and System Modeling (ICCASM 2010). vol. 10. IEEE, 2010. (Year: 2010).*

(Continued)

*Primary Examiner* — Christopher P McAndrew
(74) *Attorney, Agent, or Firm* — GableGotwals (57) ABSTRACT

Embodiments of an inline inspection ("ILI") tool (10) of this disclosure include a plurality of composite field systems (20) arranged circumferentially about the body of the ILI tool, each composite field system including multiple magnetic circuits (60) to produce a composite or resultant angled field © relative to the target, along with a sensor array or circuit (40) configured for magnetic flux leakage ("MFL") or magnetostrictive electro-magnetic acoustic transducers ("EMAT") implementations. In embodiments, the pole magnets (61) of the magnetic circuits are oriented in the axial direction of the tool body rather than in the direction of the resultant angled field. The same is true of the sensors (43). This composite field system approach provides options to design geometries that were not previously possible in prior art single-circuit helical MFL designs and EMAT designs.

20 Claims, 6 Drawing Sheets

(56) References Cited

U.S. PATENT DOCUMENTS

| | | | | |
|---|---|---|---|---|
| 4,911,784 A * | 3/1990 | Hensel | ................ | H01J 37/3266 |
| | | | | 156/345.46 |
| 4,914,412 A * | 4/1990 | Engdahl | .................. | H01L 41/12 |
| | | | | 335/215 |
| 5,231,346 A * | 7/1993 | Gassmann | ......... | G01R 29/0878 |
| | | | | 324/95 |
| 5,521,501 A * | 5/1996 | Dettmann | ............ | G01R 33/096 |
| | | | | 324/252 |
| 6,009,756 A * | 1/2000 | Willems | ............... | G01N 27/902 |
| | | | | 73/628 |
| 8,479,577 B2 | 7/2013 | Ganin | | |
| 8,653,811 B2 | 2/2014 | Simek et al. | | |
| 2010/0117635 A1 | 5/2010 | Hoyt | | |
| 2010/0327858 A1 | 12/2010 | Simek et al. | | |
| 2018/0031166 A1* | 2/2018 | Urbanski | ................ | F16L 55/26 |
| 2018/0036778 A1* | 2/2018 | Punpruk | ................. | F16L 55/38 |
| 2019/0120914 A1* | 4/2019 | Hammerschmidt | ... | G01R 33/02 |
| 2020/0049302 A1* | 2/2020 | Paulson | ................. | G01N 27/85 |

OTHER PUBLICATIONS

Gao, Song-wei, Rui Pei, and Gang Liu. "Magnetic Circuit Design Based on Circumferential Excitation in Oil-Gas Pipeline Magnetic Flux Leakage Detection." 2009 Second International Symposium on Computational Intelligence and Design. vol. 1. IEEE, 2009. (Year: 2009).*

Wang, Shen, et al. "Alternating winding magnetostrictive electromagnetic acoustic transducer for pipe torsional guided wave generation." 2010 IEEE Sensors Applications Symposium (SAS). IEEE, 2010. (Year: 2010).*

* cited by examiner

PIPELINE TOOL WITH COMPOSITE MAGNETIC FIELD FOR INLINE INSPECTION

CROSS-REFERENCE TO CO-PENDING APPLICATIONS

This application claims priority to, and the benefit of, U.S. 62/832,663 filed Apr. 11, 2019.

BACKGROUND

This disclosure is in the field of apparatuses and methods that make use of magnetic flux leakage ("MFL") and electro-magnetic acoustic transducers ("EMAT") technologies to inspect oil and gas pipelines. More specifically, the disclosure relates to oblique or angled magnetic fields applied to MFL and magnetostrictive-type EMAT technologies The benefits of an angled field when applied to MFL and magnetostrictive-type EMAT has been well established in the literature and is applied by various pipeline inspection companies. In particular, an angled field helps detect axial pipe flaws that may not be visible to traditional axial magnetic field MFL technology. See Remo Ribichini et al. Study and comparison of different EMAT configurations for SH wave inspection, 58 *IEEE Trans. Ultrasonics, Ferroelectrics, Frequency Control* 2571 (December 2011).

Figure 1:
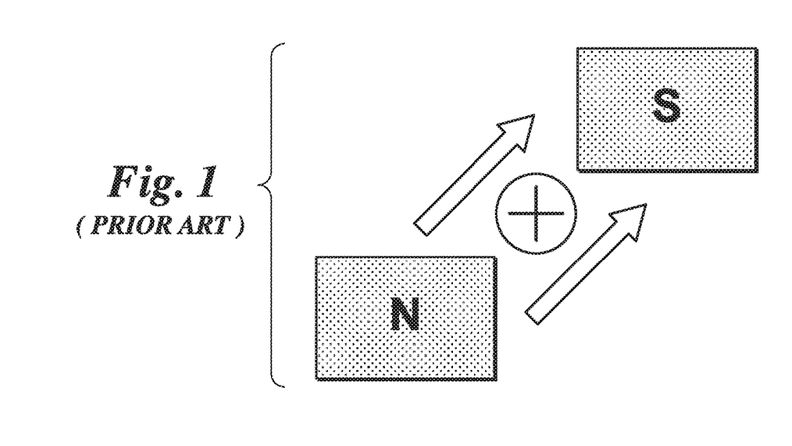
FIG. 1 is a schematic of a prior art arrangement in which an angled field is created with magnets positioned at an angle relative to the target.
Figure 2:
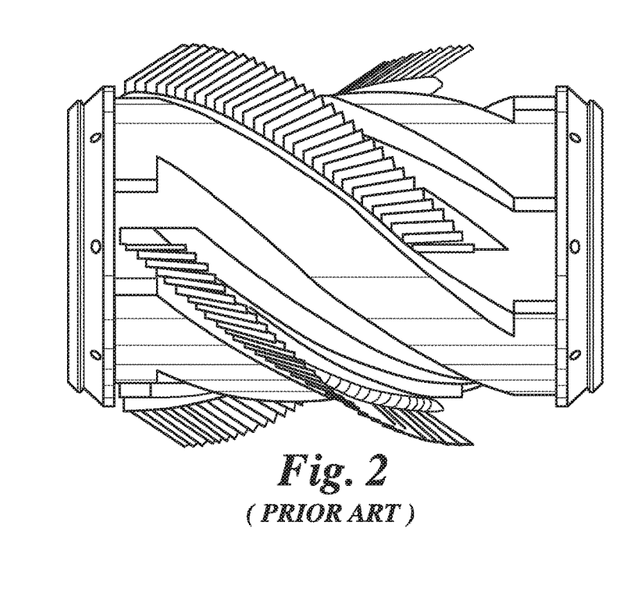
FIG. 2 is a prior art helical magnet arrangement.
Figure 3:
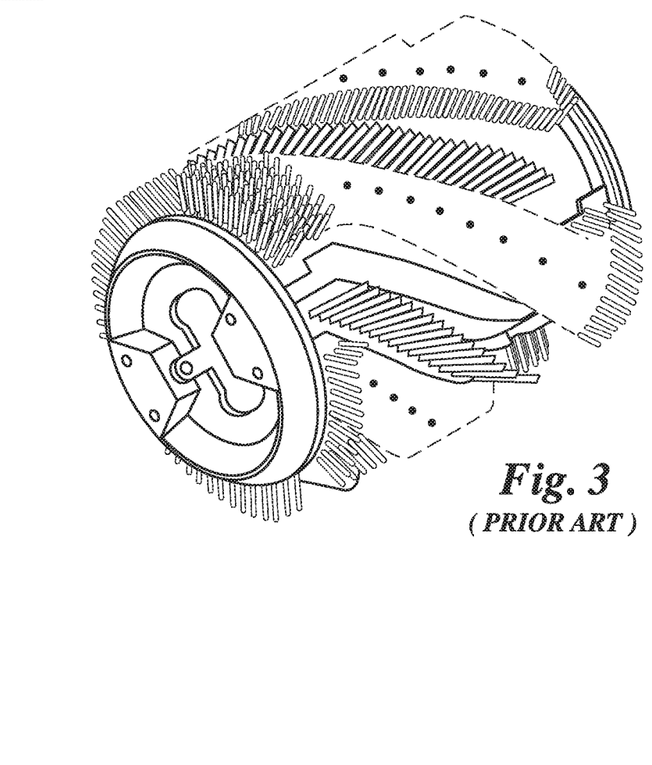
FIG. 3 is an isometric view of the prior art helical magnet arrangement of FIG. 2.
Figure 4:
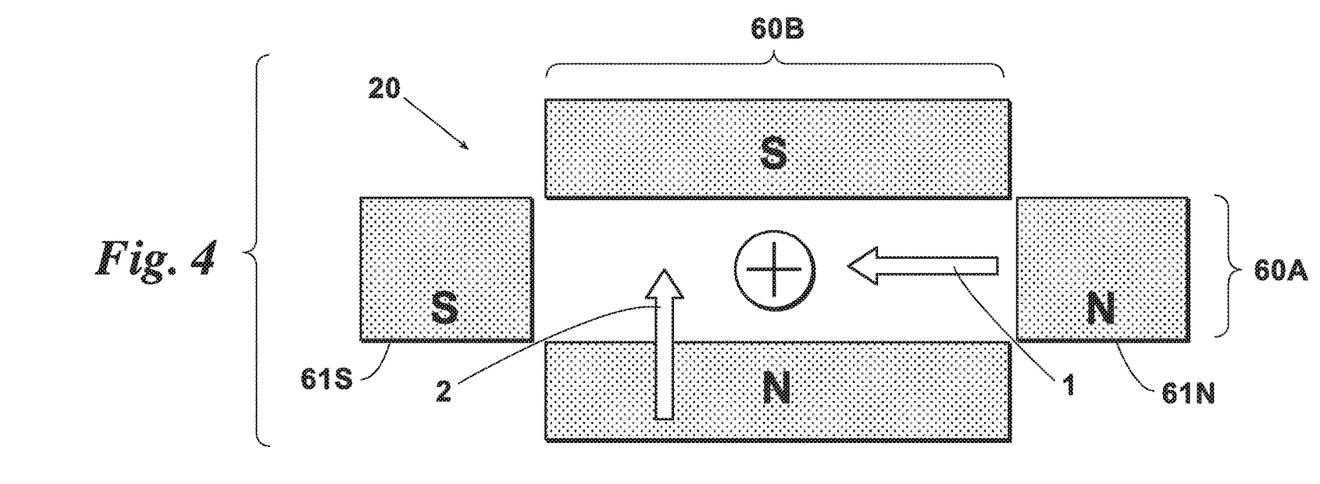
FIG. 4 is a schematic of an embodiment of this disclosure illustrating a combination of multiple magnetic circuits to produce an angled field relative to the target. The magnets of each circuit are aligned in the axial direction of an in-line inspection ("ILI") tool body.
Figure 5:
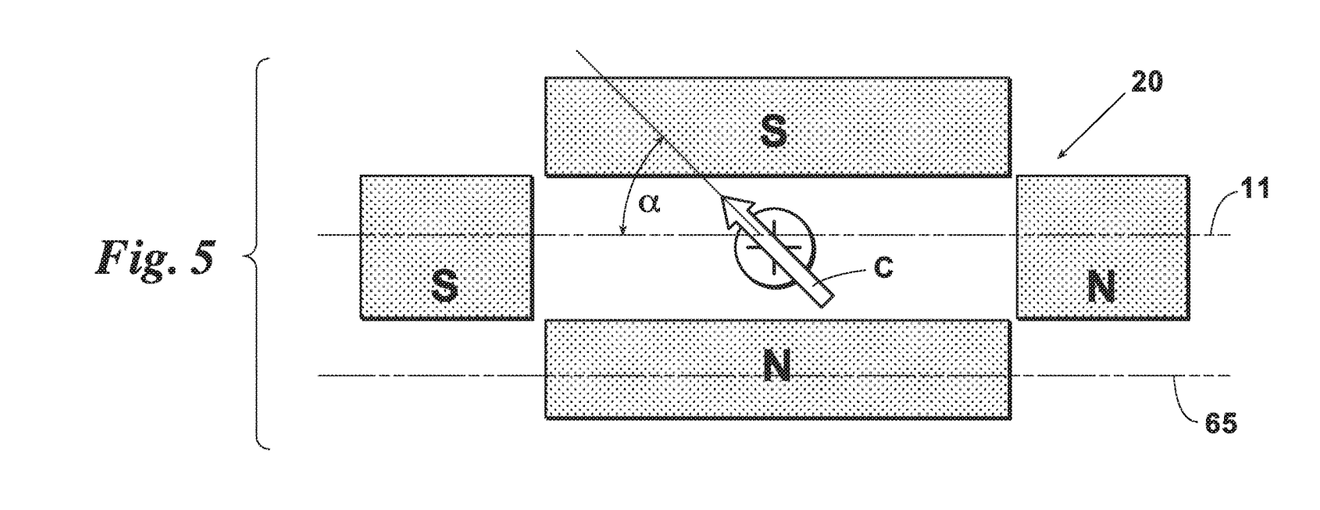
FIG. 5 is a schematic of the resultant composite field of FIG. 4.
Figure 6:
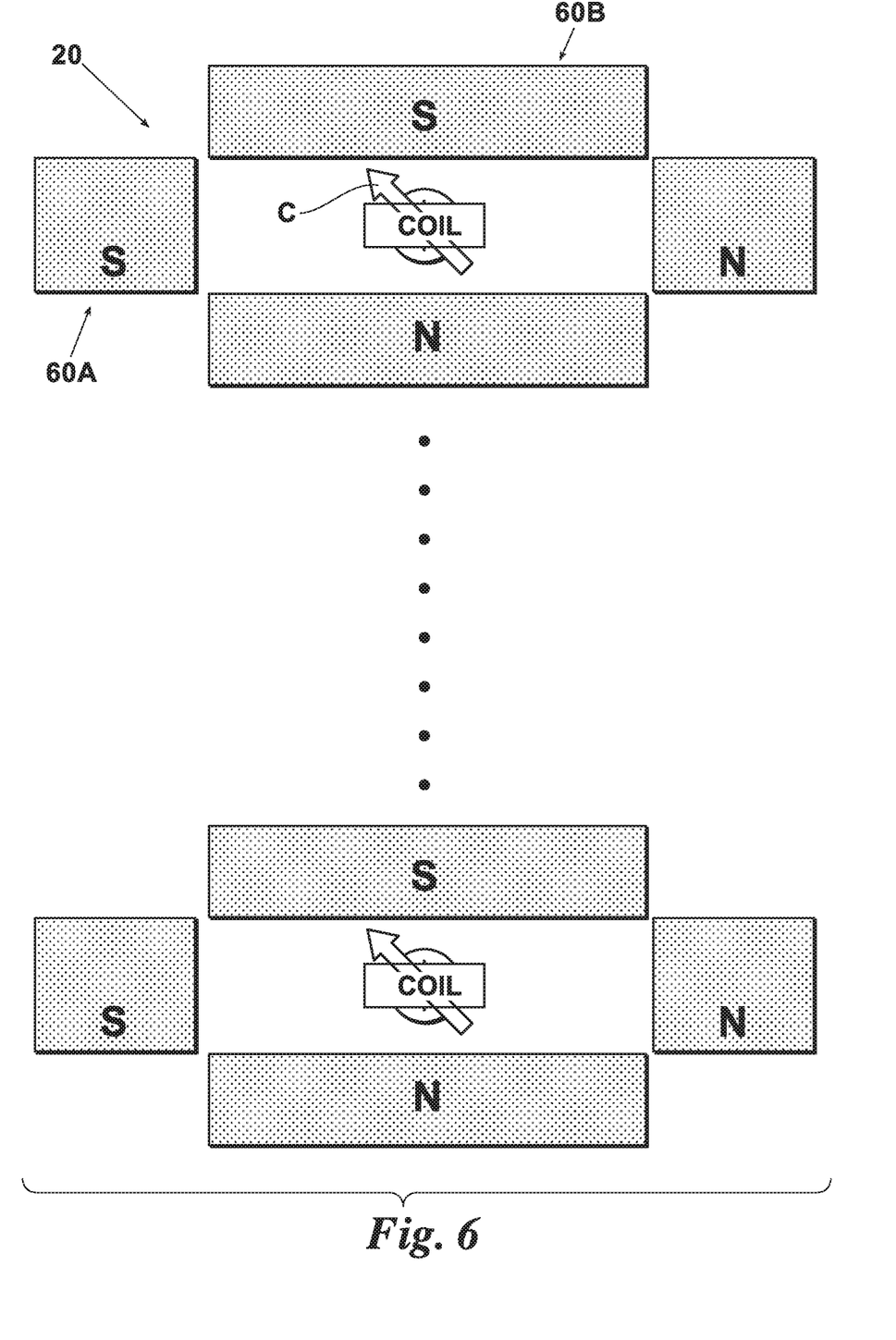
FIG. 6 is a schematic illustrating sensor arrays containing multiple magnetic circuits that each produce an angled field relative to the target. The sensor arrays may be spaced from adjacent sets circumferentially about a single ILI tool body. In some embodiments, two magnetic circuits may be used in each array.
Figure 7:
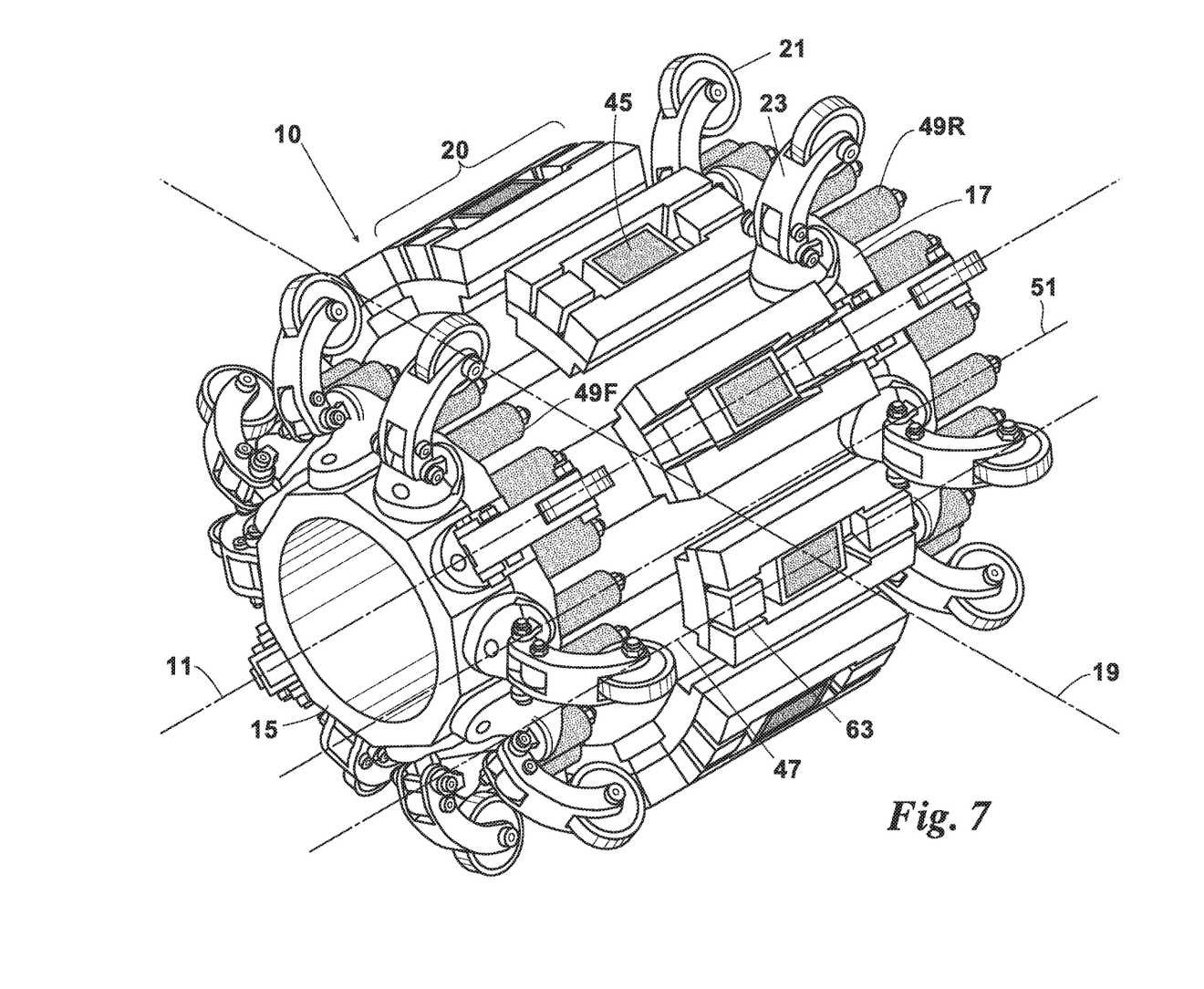
FIG. 7 is an embodiment of this disclosure including an EMAT type technology with a composite field. Multiple instances of the composite field system may be applied to a single ILI tool body.
Figure 8:
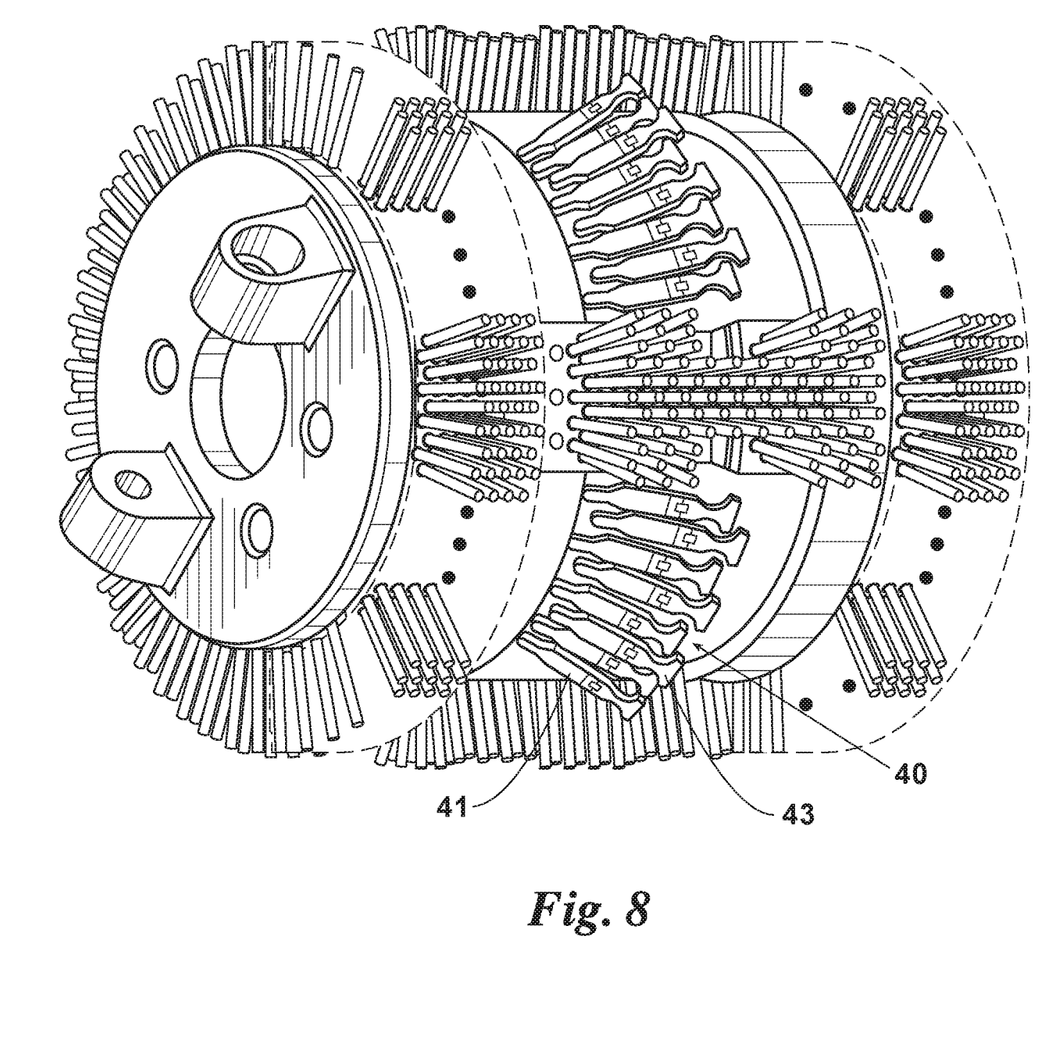
FIG. 8 is an embodiment of this disclosure including a MFL type technology with a composite field. The individual arms have sensors to detect the magnetic flux leakage. By way of example, the desired resultant composite field angle is 45°. Compared to designs in which the magnet geometry is spiraled about the ILI tool body (see e.g.
Figure 9:
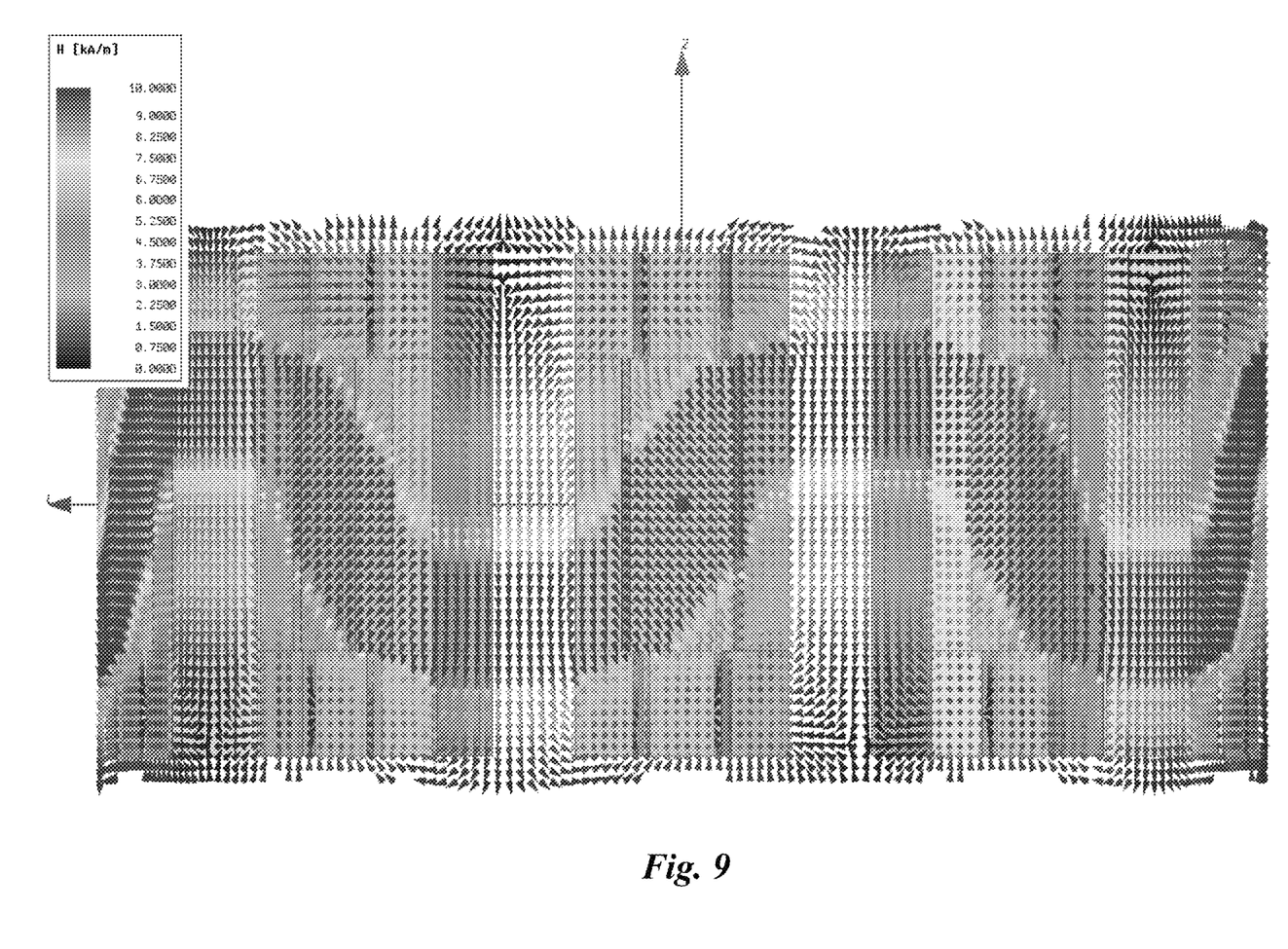
FIG. 9 is an example analysis of magnetic fields on a full tool with a composite field system of this disclosure.

Previous implementations of an angled magnetic field have been accomplished by either turning the transmitters and receivers relative to the axial field (the field of a typical MFL) or, as seen in FIG. 1, by arranging the magnets to reflect the shape of the desired field relative to the target. For example, Rosen Group achieves an angled field in effect by using a single magnetic circuit and turning the transmitters and receivers with respect to the axial field provided by the circuit. See e.g. DE 10/2007/0058043. T. D. Williamson, Inc. also makes use of a single circuit but achieves an actual angled field relative to the pipe axis by arranging the magnets in a helical pattern along the length of the cylindrical shaped tool. See FIGS. 2 & 3; see also U.S. Pat. Nos. 8,319,494 B2 and 8,653,611 B2. However, the complex geometries associated with helical magnet arrangements impose design constraints that may limit their application even though the angled fields may be advantageous. Others, like General Electric Company, use a periodic permanent magnet approach to EMAT technology in which the angled field is not applicable.

SUMMARY

Embodiments of an inline inspection ("ILI") tool of this disclosure include a composite field system arranged circumferentially about the body of an ILI tool, each composite field system including multiple magnetic circuits to produce a composite or resultant angled field relative to the target, along with a sensor coil circuit configured for magnetic flux leakage ("MFL") or magnetostrictive electro-magnetic acoustic transducers ("EMAT") implementations. In embodiments, the pole magnets of the magnetic circuits are oriented in the axial direction of the tool body rather than in the direction of the resultant angled field. The same is true of the sensors.

This composite field system approach provides options to design geometries that were not previously possible in prior art single-circuit helical MFL designs and EMAT designs. For example, the physics of EMAT requires relatively large sensors and helical magnetizer geometries which introduce design constraints that prohibit optimal sensor densities and arrangements that the technology requires. However, the composite field system approach of this disclosure enables these technologies to be implemented in a smaller mechanical design envelope for a given ILI tool body size. Additionally, the overall magnet design is simpler to produce and may improve fabrication costs and servicing costs.

In embodiments, an ILI tool of this disclosure comprises:
at least one composite magnetic field system containing two magnetic circuits configured to provide a resultant magnetic field in at an angle $\alpha$ relative to the axial direction of the ILI tool body, where $0°<\alpha<90°$, $0°$ being the axial direction, $90°$ being the transverse direction;
one of the two magnetic circuits providing a first magnetic field in a first direction including a first polarity pole magnet and a second different polarity pole magnet oriented at an angle different than the angle $\alpha$;
another of the two magnetic circuits providing a second magnetic field in a second different direction and including another first polarity pole magnet and another second different polarity pole magnet oriented at another angle different than the angle $\alpha$;

The magnets of the first field may be the same strength as those of the second different field, or they may differ in strength from those of the second different field. Additionally, the magnets within each field may be the same strength or differ in strength from one another. The first direction may be the axial direction, the second different direction may be the transverse direction (or vice versa). In other embodiments, the first and second different directions may be at oblique angles relative to the axial or transverse directions. Both directions are different than that of the composite resultant magnetic field.

The ILI tool may be configured for MFL or EMAT. In MFL configurations, each magnetic circuit includes one or more sensors of a kind known in the art to detect the magnetic flux leakage. In EMAT configurations, the ILI tool includes a sensor coil circuit including a transducer and at least two receiver coils, the receiver coil located forward and rearward of the transducer in a same direction as the respective magnetic circuit direction. Regardless of MFL or EMAT configuration, neither the magnets nor the sensors are oriented at the same angle as the composite resultant field.

BRIEF DESCRIPTION OF THE DRAWINGS

FIGS. 3A & 3B), the composite field arrangement enables simpler magnet geometry and a number of other design advantages.

Definitions

For the purposes of this disclosure, the following definitions apply.

Angled field—a magnetic field having lines of flux oriented at an angle $\alpha$ relative to the axial direction, $0°<\alpha<90°$.

Axial direction—the direction at an angle $\alpha=0°$ relative to a longitudinal axis of a target such as a tubular or pipeline section or an inline inspection tool body.

Axial field—a magnetic field having lines of flux oriented in axial direction.

Inline inspection ("ILI") tool body—a generally cylindrical shaped body configured for use in a section of pipeline and extending in the axial direction.

Magnetic circuit—a pair of opposite polarity magnets, spaced a predetermined distance apart from one another, the magnets being sized and spaced to create a (static) magnetic field oriented in a predetermined direction relative to the ILI tool body. For example, the predetermined direction may be an axial direction of the tool, a transverse direction of the tool, or oriented at an oblique angle relative to the axial or transverse directions.

Multiple magnetic circuit—at least two magnetic circuits that each produce their own magnetic field in a first direction and a second different direction, respectively, the first and second fields in combination producing a resultant or composite magnetic field in a third different direction. The magnets of each circuit are not are not angled to reflect the shape of the composite field. The third different direction may be a predetermined selected angle $\alpha$ relative to the axial direction of the ILI tool body. For example, $0°<\alpha<90°$ or $40°<\alpha<50°$.

Sensor array or circuit—One or more sensors located in close proximity to a magnetic circuit and configured for magnetic flux leakage ("MFL") signal detection or electro-magnetic acoustic transducers ("EMAT") signal detection. By way of example, in an EMAT implementation, the sensor array or circuit includes a transmitter and receivers. The sensor array or circuit may have the same orientation as the magnets of the circuit.

Transverse or circumferential direction—the direction at an angle $\alpha=90°$ relative to the axial direction.

Transverse field—a magnetic field having lines of flux oriented in the circumferential direction.

DETAILED DESCRIPTION

Referring to FIGS. 4-9, embodiments of an ILI tool body 10 of this disclosure use multiple magnetic circuits rather than a single magnetic circuit, avoid turning the sensor array or circuit relative to the axial (or transverse) field to create an angled composite field relative to a target, and avoid the complex geometries used in the prior art in which the magnets are arranged to reflect the shape of the desired angled field. In embodiments of this disclosure a plurality of composite magnetic field systems 20 are circumferentially spaced apart from one another about an ILI tool body 10, each system 20 including a sensor array or circuit 40 and at least two magnetic circuits 60. In some embodiments, the composite field system 20 is configured for use in magnetic flux leakage ("MFL") implementations. In other embodiments, the composite field system 20 is configured for use in magnetostrictive-type electro-magnetic acoustic transducers ("EMAT") implementation (as opposed to Lorenz-type EMAT).

The ILI tool body 10 is typically cylindrical shaped about its central axial axis 11. The composite magnetic field system 20 is arranged about the external surface 13 of the tool body 10 between the forward 15 and rearward ends 17 of the tool body 10 For the purposes of this disclosure, the central axial axis 11 of the tool body 10 represents the axial direction and the central transverse axis 19 of the tool body 10 represents the transverse direction. The tool body 10 may include a plurality of wheels 21 mounted on arms 23, and the tool body 10 may be connected to a pigging train or pigging module of kind known in the art for moving inline inspection tools through a pipeline.

In MFL configurations, the sensor array 40 may include a plurality of arms 41 including sensors 43 arranged circumferentially about the ILI tool body 10. The individual sensors 43 may be of a kind well-known in the art for detecting magnetic flux leakage signals. In EMAT configurations, the sensor array 40 may include at least one transmitter 45 and a receiver 49 aligned in the axial direction. The central axial axis 47 of the transmitter 45 is parallel to, or lies in a same plane as, the central axial axis 11 of the tool body. Similarly, the central axial axis 51 of the receiver 49 is parallel to, and lies in a same plane as the central axial axis 11 of the tool body 10. The transmitter 45 may be an external piezoelectric transducer or an electro-magnetic acoustic transducer of a kind known in the art. In some embodiments, the receiver 49 may include two receiver coils, one forward and the other rearward (e.g. 49F, 49R) of the transmitter 45 in the axial direction. In other embodiments, multiple receiver coils are used at each end 15, 17 of the tool body 10, the coils being aligned in the axial direction.

In embodiments, the two magnetic circuits 60 may each include opposite polarity magnets 61N, 61S aligned in the axial direction, the circuits 60 configured relative to one another such that a composite magnetic field C is produced at an angle $\alpha$ relative to the axial direction. One of the magnetic circuits 60A may form a field 1 in the axial direction and another magnetic circuit 60B may form a field 2 in the transverse direction. In embodiments, each pole magnet 61N, 61S of the first circuit 60A may be spaced apart from one another in the axial direction of the ILI tool body 10 and each pole magnet 61N, 61S of the second circuit 60B may be spaced apart from one another in the transverse direction, there being a predetermined size gap 63 between the magnets 61N, 61S. The field 1 or 2 of each magnetic circuit 60A, 60B may be combined with field 2 or 1 the other 60B, 60A through vector addition to produce a composite angled field C.

By way of a non-limiting example, vector addition of field 1, produced in the axial direction by a first magnetic circuit 60A, and field 2, produced in the transverse direction by a second magnetic circuit 60B, produce a resultant composite field C lying at an angle $\alpha$ relative to the axial direction. See e.g. FIGS. 4 & 5. This resultant field C acts as an angled single field through the target even though it is composed of multiple individual fields 1, 2 and even though the magnets 61 of each circuit 60, as well as the transmitter 45 and receiver 49 of the sensor circuit 40, are aligned in the axial direction.

The resultant magnitude and direction of the composite magnetic field C is the field of interest for targeted regions of a tubular such as a pipe or vessel and can be controlled through the arrangement of the individual fields 1 and 2. For example, field 1 and field 2 can be specified to achieve a desired or predetermined, angle α of the resultant composite magnetic field C. In some embodiments, α is in a range of 40° to 50°, with 45° being considered optimal for some ILI inspection technologies. However, any desired angle α could be achieved in a range of 1° to 89° relative to the axial or transverse direction, there being discrete values and subranges within this broader range.

The field 1 and 2 magnets 61 may differ from one another in strength to produce the resultant composite angled field. Additionally, the strength of the magnets 61 may vary within each circuit 60. The variations within or between the circuits 60 affect how the fields 1, 2 sum. The size, shape, or size and shape of the magnets 61 may vary. In some embodiments, the field 1 magnets 61 may be shorter length magnets, with the field 2 magnets 61 being a longer length and located along a respective side of the transmitter 45. Additionally, the polarity of the magnets 61 may be reversed from those shown in the drawings. Regardless of strength, length, or field direction, each magnet 61 is aligned in the axial direction. In other words, the magnets 61, similar to sensors 41 of the sensor array 40, are oriented so that the central axial axis 65 lies in a same plane as the central axial axis 11 of the ILI tool body 10 (and therefore the tubular when in use).

In embodiments, multiple instances of a composite field system 20 can be applied to a single ILI body 10. As a result, multiple regions of angled field C can be created with cleaner mechanical layout, there being no need to spiral the magnets 61 about the body 10 or position the magnets 61 at an angle relative to the target. Instead, the magnets 61 may be arranged in the axial direction. The composite field C provides design options that are not achievable with a single magnetic circuit and can be accomplished in a smaller design envelope.

While embodiments of this disclosure have been described in detail, persons of ordinary skill in the art could make modifications to the embodiments without departing from the scope of the following claims. The claims include the full range of equivalents to which the recited elements are entitled.

The invention claimed is:

1. An inline inspection tool body (10) comprising:
a plurality of composite magnetic field systems (30), each composite magnetic field system of the plurality containing two magnetic circuits (60A, 60B) arranged relative to one another to provide a resultant magnetic field (C) at an angle α relative to an axial direction of the inline inspection tool body, where 0°<α<90°, 0° being the axial direction, 90° being a transverse direction, the resultant magnetic field including a first magnetic field (1) and a second magnetic field (2) and being a vector addition of the first and second magnetic fields;
each of the two magnetic circuits including a first polarity pole magnet (61N or 61S) and a second polarity pole magnet (61S or 61N) having a different polarity than the first polarity pole magnet, the first and second polarity pole magnets spaced apart from one another, each of the first and second polarity pole magnets oriented at an angle different than the angle α of the resultant magnetic field;
a first (60A) of the two magnetic circuits providing the first magnetic field (1) in a first direction, a second (60B) of the two magnetic circuits providing the second magnetic field (2) in a second direction different than that of the first magnetic field.

2. The inline inspection tool body of claim 1, wherein, one of the first and second directions is the axial direction and another one of the first and second directions is the transverse direction.

3. The inline inspection tool body of claim 1, wherein, the first magnetic field has a first strength and the second magnetic field has a second strength different than that of the first strength.

4. The inline inspection tool body of claim 1, wherein, the angle of orientation of the first and second polarity pole magnets is the axial direction.

5. The inline inspection tool body of claim 1, further comprising:
each composite magnetic field system including a sensor array (40) configured to detect a corresponding one of the resultant magnetic field.

6. The inline inspection tool body of claim 5, further comprising:
the sensor array including a sensor (43) configured for magnetic flux leakage sensing.

7. The inline inspection tool body of claim 5, further comprising:
the sensor array including a sensor (43) configured for magnetostrictive electro-magnetic acoustic transducer sensing.

8. The inline inspection tool body of claim 5, further comprising:
the sensor array including sensors (43), each sensor oriented at an angle different than the angle α of a corresponding one of the resultant magnetic field.

9. The inline inspection tool body of claim 1, wherein, the angle α is in a range of 40° to 50°.

10. The inline inspection tool body of claim 9, wherein, the angle α is 45°.

11. A method of inspecting a wall of tubular using an inline inspection tool body, the method comprising:
collecting data indicative of wall quality using a plurality of composite magnetic field systems 30 arranged about the inline inspection tool body;
wherein each composite magnetic field system of the plurality contains two magnetic circuits (60A, 60B) arranged to provide a resultant magnetic field (C) at an angle α relative to an axial direction of the inline inspection tool body, where 0°<α<90°, 0° being the axial direction, 90° being a transverse direction, the resultant magnetic field including a first magnetic field (1) and a second magnetic field (2) and being a vector addition of the first and second magnetic fields; and
wherein each of the two magnetic circuits include a first polarity pole magnet (61N or 61S) and a second polarity pole magnet (61S or 61N) having a different polarity than the first polarity pole magnet, the first and second polarity pole magnets spaced apart from one another, each of the first and second polarity pole magnets oriented at an angle different than the angle α of the resultant magnetic field; and
wherein a first (60A) of the two magnetic circuits provides the first magnetic field (1) in a first direction, a second (60B) of the two magnetic circuits provides the second magnetic field (2) in a second direction different than that of the first magnetic field.

12. The method of claim 11, wherein, one of the first and second directions is the axial direction and another of the first and second directions is the transverse direction.

13. The method of claim 11, wherein, the first magnetic field has a first strength and the second magnetic field has a second strength different than that of the first strength.

14. The method of claim 11, wherein, the angle of orientation of the first and second polarity pole magnets is the axial direction.

15. The method of claim 11, wherein, each composite magnetic field system includes a sensor array (40) configured to detect a corresponding one of the resultant magnetic field.

16. The method of claim 15, wherein, the sensor array includes a sensor (43) configured for magnetic flux leakage sensing.

17. The method of claim 15, wherein, the sensor array includes a sensor (43) configured for magnetostrictive electro-magnetic acoustic transducer sensing.

18. The method of claim 15, wherein, the sensor array includes sensors (43), each sensor oriented at an angle different than the angle $\alpha$ of a corresponding one of the resultant magnetic field.

19. The method of claim 11, wherein, the angle $\alpha$ is in a range of 40° to 50°.

20. The method of claim 11, wherein, the angle $\alpha$ is 45°.

* * * * *